United States Patent
Bettinelli et al.

(10) Patent No.: US 8,110,984 B2
(45) Date of Patent: Feb. 7, 2012

(54) ORGANIC LIGHT-EMITTING DIODE WITH TRANSPARENT MULTILAYER ELECTRODE

(75) Inventors: Armand Bettinelli, Coublevie (FR); Jean-Yves Michellys, Thorigni-Fouillard (FR); Jean-Claude Martinez, Chartres de Bretagne (FR)

(73) Assignee: Commissariat a l'Energie Atomique, Paris (FR)

( * ) Notice: Subject to any disclaimer, the term of this patent is extended or adjusted under 35 U.S.C. 154(b) by 532 days.

(21) Appl. No.: 12/223,599

(22) PCT Filed: Feb. 27, 2007

(86) PCT No.: PCT/FR2007/000357
§ 371 (c)(1),
(2), (4) Date: Aug. 14, 2008

(87) PCT Pub. No.: WO2007/096538
PCT Pub. Date: Aug. 30, 2007

(65) Prior Publication Data
US 2009/0251045 A1    Oct. 8, 2009

(30) Foreign Application Priority Data
Feb. 27, 2006  (FR) ...................................... 06 50676

(51) Int. Cl.
*H01J 29/28*    (2006.01)
(52) U.S. Cl. ................... 313/506; 313/498; 313/504
(58) Field of Classification Search .......... 313/498–512; 428/690–691, 917; 438/26–29, 34, 82; 257/40, 257/72, 98–100, 642–643, 759; 427/66, 427/532–535, 539; 445/23–25
See application file for complete search history.

(56) References Cited

U.S. PATENT DOCUMENTS

| | | | | |
|---|---|---|---|---|
| 5,078,634 A | * | 1/1992 | Yoshioka | ...................... 445/25 |
| 5,093,698 A | | 3/1992 | Egusa | |
| 5,969,474 A | | 10/1999 | Arai | |

(Continued)

FOREIGN PATENT DOCUMENTS

EP   0 498 979 A1   8/1992

(Continued)

OTHER PUBLICATIONS

Feng et al., "Electron injection and electroluminescence investigation of organic light-emitting devices based on a Sn/Al cathode", Synthetic Metals, Elsevier Sequoia, vol. 126, No. 2-3, Feb. 14, 2002, pp. 347-350.

*Primary Examiner* — Toan Ton
*Assistant Examiner* — Fatima Farokhrooz
(74) *Attorney, Agent, or Firm* — Oliff & Berridge, PLC

(57) ABSTRACT

An organic light-emitting diode comprising a substrate, an organic light-emitting layer arranged between a first electrode and a transparent and semi-reflecting second electrode with a multilayer structure subdivided into:
  a first silver-based metallic layer in contact with the organic light-emitting layer,
  a second aluminum-based metallic layer, and a third dielectric layer,
wherein the second metallic layer is inserted between the first metallic layer and the third dielectric layer of the transparent second electrode, the organic light-emitting layer comprises a doped sub-layer in contact with the first metallic layer of the transparent second electrode, and the thickness of the third dielectric layer is adjusted to limit the absorption by the first and second metallic layers of the light emitted by the diode.

9 Claims, 2 Drawing Sheets

U.S. PATENT DOCUMENTS

| | | | |
|---|---|---|---|
| 6,013,384 | A | 1/2000 | Kido et al. |
| 6,433,355 | B1 | 8/2002 | Riess et al. |
| 6,566,807 | B1 | 5/2003 | Fujita et al. |
| 7,074,500 | B2 | 7/2006 | Pfeiffer et al. |
| 7,449,830 | B2 * | 11/2008 | Aziz .................. 313/504 |
| 2004/0140757 | A1 | 7/2004 | Tyan et al. |
| 2004/0149984 | A1 | 8/2004 | Tyan et al. |
| 2004/0155576 | A1 | 8/2004 | Tyan et al. |
| 2005/0088080 | A1 | 4/2005 | Cheng et al. |
| 2006/0138941 | A1 * | 6/2006 | Wittmann .............. 313/504 |
| 2006/0158103 | A1 * | 7/2006 | Katano et al. ........... 313/504 |

FOREIGN PATENT DOCUMENTS

| | | |
|---|---|---|
| EP | 1 017 118 A2 | 7/2000 |
| EP | 1 076 368 A2 | 2/2001 |
| EP | 1 439 589 A2 | 7/2004 |
| EP | 1 443 572 A2 | 8/2004 |
| JP | A-09-035871 | 2/1997 |
| JP | A-11-135265 | 5/1999 |
| WO | WO 02/41414 A1 | 5/2002 |

* cited by examiner

ORGANIC LIGHT-EMITTING DIODE WITH TRANSPARENT MULTILAYER ELECTRODE

BACKGROUND OF THE INVENTION

The invention relates to an organic light-emitting diode (OLED) with a transparent multilayer electrode, either bottom, in direct contact with the substrate, or top, opposite from the substrate with respect to the light-emitting layer.

STATE OF THE ART

In the document US 2005/0088080, a transparent electrode presents a multilayer structure in the following order: a LiF injection layer, an Ag layer, an Al layer, and a TeO2 dielectric.

The document U.S. Pat. No. 5,969,474 describes an organic light-emitting diode comprising:
- an organic layer inserted between a bottom electrode in contact with a substrate and a transparent top electrode comprising a first metallic layer, for example made of silver alloy such as Mg—Ag, which is in contact with the organic layer,
- and a transparent top dielectric layer formed by a transparent conducting oxide such as ITO or IZO, which covers the first metallic layer.

A buffer layer is inserted between the first metallic layer and the transparent conducting oxide-based layer to prevent the metal of the metallic layer from being oxidized at the interface with the transparent oxide layer. The buffer layer is preferably formed by a metal such as Ti, Cr, Ta, or by a nitride of these metals; its thickness is comprised between 5 and 20 nm, preferably between 5 and 10 nm. Such metals (in particular Ti, Ta) are particularly difficult to deposit in a vacuum (high sublimation temperature: 1600° C. to 1700° C.), or (in particular Cr) are liable to damage the underlying organic layers.

The problem to be solved is to provide a buffer layer material that is easier to deposit in a vacuum, and to provide better protection against oxidation or any equivalent reaction degrading the first metallic layer when the latter is specifically silver-based. This problem of degradation has moreover been observed with other oxides such as ITO or IZO, such as for example with SiO, or even with sulphides or selenides.

This metallic layer of silver of the top electrode generally has three functions—a function of injecting charges into the organic layer, a function of electric conduction by charge transport, and a reflecting or semi-reflecting function useful for forming an optic cavity able to improve extraction of emitted light. The charges in question are generally electrons and this top electrode is then a cathode.

The diode generally comprises a bottom layer able to reflect the light emitted by the light-emitting layer; this layer is generally formed by the bottom electrode. The gap comprised between the reflecting bottom layer and the silver-based first metallic layer of the top electrode, which is at least semi-reflecting, forms an optic cavity which, when it is adjusted in resonance in a manner known in itself, enables extraction of the light emitted by the diode to be optimized and even enables the chromatic coordinates of the light extracted from the diode to be adjusted.

The transparent dielectric top layer of the diode has the purpose in particular of optimizing the above-mentioned optic cavity, by improving in particular the transparency of the top electrode, in particular in the case where the thickness of the metallic layer of this electrode is relatively large (and therefore potentially absorbent) to ensure an efficient distribution of the charges. Such an effect of reducing the absorption of a metallic layer by adding a dielectric layer is described in particular in the documents EP1076368, EP1439589 and EP1443572. These documents describe diodes emitting via a single face where a dielectric layer is added to one of the transparent electrodes (see FIG. 4d in EP1439589); this dielectric layer (referenced 22, made from ZnS: 20% $SiO_2$ material) has a function of reducing absorption of the light emitted through the transparent or semi-transparent electrode whereto it is adjoined. It has however been observed that dielectric materials which are the most suitable for limiting absorption by an underlying metallic layer of silver were often liable to react with the silver. The chemical reactions at the interface between the metallic layer of silver and the transparent top dielectric layer that covers it are however liable to degrade on the one hand the electric performances of the diode, since injection and transporting of charges will be degraded, and on the other hand the optic performances, since the resonant light extraction optic cavity is "out of tune". One object of the invention is to avoid these drawbacks.

The article entitled "Electron injection and electroluminescence investigation of OLED devices based on a Sn/Al or Ag/Al cathode", written by M M Feng Li, Jing Feng, Gang Cheng, and Shiyong Liu, in the review Synthetic Metals, vol. 126, no. 2-3, pp. 347-350, 14/02/2002, concerns diodes whose top electrode is not transparent, as it comprises a metallic layer of aluminum that is too thick (120 nm) to be transparent; this metallic layer is not covered by a transparent dielectric layer. This document indicates that, when used as metallic layer in contact with the organic light-emitting layer, aluminum tends to diffuse into this layer, which degrades the performances of the diode; to prevent this diffusion in the organic layer, this document teaches insertion of a metallic buffer layer, with a silver or tin, base between the metallic layer and the organic light-emitting layer. Top electrode is then formed by two stacked metallic layers. Other documents describe electrodes formed by stacking of two metallic layers, for example the document JP09-035871.

OBJECT OF THE INVENTION

The object of the invention is to limit the reactions between the silver of the first metallic layer and the dielectric material to prevent degradation of the diode performances.

It is a further object of the invention to provide an organic light-emitting diode comprising a substrate, an organic light-emitting layer arranged between a first electrode and a second transparent and semi-reflecting electrode with a multilayer structure subdivided into:
- a first silver-based metallic layer in contact with the organic light-emitting layer,
- a second aluminum-based metallic layer,
- and a third dielectric layer, characterized in that the second metallic layer is inserted between the first metallic layer and the third dielectric layer of the transparent second electrode, that the organic light-emitting layer comprises a doped sub-layer in contact with the first metallic layer of the transparent second electrode, and that the thickness of said third dielectric layer is adjusted to limit the absorption by said first and second metallic layers of the light emitted by the diode.

The organic light-emitting layer comprises at least a proper light-emitting sub-layer, and generally a hole injection and transporting sub-layer between the electrode acting as anode and this light-emitting sub-layer, and also generally an electron injection and transporting sub-layer between the electrode acting as cathode and this light-emitting sub-layer. It is also frequent to find an electron blocking sub-layer between the hole injection and transporting sub-layer and the light-emitting sub-layer, and/or a hole blocking sub-layer between the electron injection and transporting sub-layer and the light-emitting sub-layer.

The light-emitting sub-layer is able to emit light when a current flows in the diode; limitation of the absorption of this light is obtained as described in particular in the documents EP1076368, EP1439589 and EP1443572.

The reactions between the silver of the first metallic layer and the dielectric material of the absorption-limiting dielectric layer are limited due to the aluminum-based second metallic layer which performs a "buffer" function, advantageously preventing degradation of the diode's performances which would result from these reactions.

The material of said dielectric layer is preferably chosen from the group formed by a transparent conducting oxide, in particular ITO and IZO. ITO stands for mixed Indium and Tin Oxide; IZO stands for mixed Indium and Zinc Oxide. These materials are advantageously conducting.

According to another alternative embodiment, the material of said dielectric layer is chosen from the group formed by SiO, ZnS, SnS, TeO2 and SnO2. These materials are insulating.

The total thickness of the first and second metallic layers is preferably comprised between 10 and 40 nm. Preferably, the thickness of the second metallic layer is comprised between 3 and 10 nm. Absorption of light by these layers is thereby limited.

The first electrode is preferably semi-reflecting or reflecting. There is therefore an optic cavity between the two electrodes. The distance between the two electrodes is preferably adjusted to optimize the extraction performances of light emitted by the diode. We therefore have a resonant optic cavity.

It is a further object of the invention to provide a lighting or image display panel comprising a plurality of diodes according to the invention.

DETAILED DESCRIPTION OF THE INVENTION

The invention will be better understood on reading the following description, given for non-restrictive example purposes only with reference to the appended drawings in which.

Figure 1:
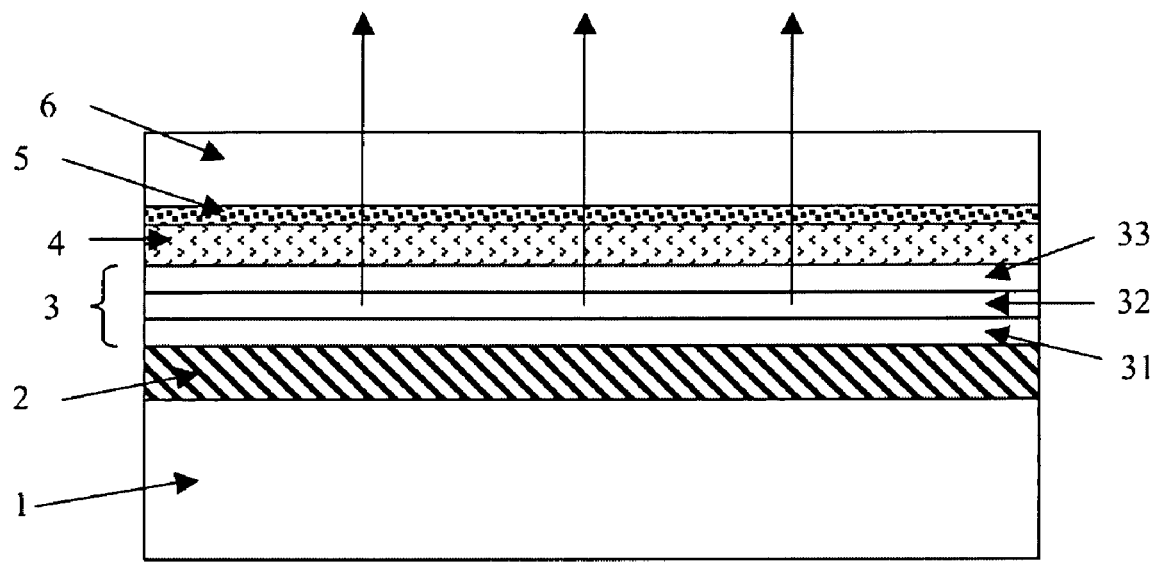
FIG. 1 illustrates a schematic view of a diode according to the invention, corresponding to a non-transparent substrate adapted to an "upward" photon emission, i.e. through the transparent top electrode.

Fabrication of a diode according to the embodiment of FIG. 1 will now be described.

Bottom electrode 2, here an anode, is deposited on a substrate 1. It is formed by a metallic layer, for example made from silver, aluminum, or even gold, which are strongly reflecting metals. This electrode therefore forms here a reflecting bottom layer. The following are successively deposited on electrode 2:
- an organic sub-layer made of p-doped semi-conducting organic material forming a hole injection and transporting organic sub-layer 31,
- an organic sub-layer made of organic material doped with a light-emitting dopant forming an organic light-emitting sub-layer 32,
- an organic sub-layer made of n-doped semi-conducting organic material forming an electron injection and transporting organic sub-layer 33.

The materials and the thickness of these sub-layers are known as such, for example from the documents EP0498979, EP1017118, U.S. Pat. Nos. 6,013,384, 6,433,355 and WO02/41414.

Stacking of sub-layers 31 to 33 forms the organic light-emitting layer 3.

A first metallic layer 4, here made of silver, and a second metallic layer 5 made of aluminum, are deposited on this stacking. Although silver is not reputed to have very good performances for injecting electrons into organic layer 3, it can however be used for this purpose, due to the use of an n-doped organic sub-layer 33 in contact with this first layer 4; silver is preferred to aluminum which is less transparent and less reflecting than silver. The total thickness of first metallic layer 4 and second metallic layers 5 is preferably comprised between 10 and 40 nm, according in particular to the best compromise between:
- a sufficiently high transparency to the light emitted by the light-emitting layer, which is fostered by the subsequently deposited dielectric layer 6;
- sufficiently high conductivity for injection of electrons into the underlying organic layer 3;
- and the semi-reflecting function required for obtaining the optic cavity between the bottom electrode and top electrode.

Aluminum and silver are advantageously used as base of the top electrode, because they both present a high electric conductivity. This top electrode is here a cathode. However, as aluminum intrinsically presents a much lower transparency than silver to the light emitted by the light-emitting layer, the thickness of second metallic layer 5 is sought to be minimized compared with that of first metallic layer 4. The thickness of the aluminum layer is preferably comprised between 3 and 10 nm; over 10 nm, the losses by absorption of light emitted in this layer are in general too high; under 3 nm, the "buffer" function of the aluminum layer, specified hereafter, is no longer in general sufficiently efficient. The thickness of first metallic layer 4 is therefore preferably larger than the thickness of second metallic layer 5.

A dielectric layer 6, made for example of SiO or of any other material, is deposited, for example by vacuum cathode sputtering, on the double metallic layer thus obtained; the thickness of this layer 6 is preferably defined so to reduce the absorption of the underlying metallic layers 4 and 5, or even to optimize the extraction and colorimetry performances provided by the optic cavity formed between the reflecting bottom electrode and semi-reflecting top electrode. The thickness of this dielectric layer 6 can contribute to protection (encapsulation function) of the underlying organic layer 3 against risks of deterioration by oxygen and/or ambient humidity. When the dielectric material of this layer is in particular ITO, it can contribute to the conductivity of the top electrode.

A diode according to the first embodiment of the invention illustrated in FIG. 1 is then obtained. Thanks to second metallic layer 5 of aluminum which performs a "buffer" function between the silver of first metallic layer 4 and the material of transparent dielectric top layer 6, the chemical reactions between these layers 4 and 6 are limited, which prevents degradation of the diode's performances and facilitates optimization of the optic cavity between the electrodes. In parallel, it is observed that the fabrication process is much more reproducible.

The hypothesis of the "buffer" function of the aluminum layer is supported by the following observations:

a diode whose top electrode only comprises a single metallic layer of aluminum functions, even if the thickness of this layer is very small and about 5 nm; this illustrates the absence of chemical reaction between the aluminum and the material of transparent top dielectric layer 6, in particular when this material is an oxide;

a diode whose top electrode only comprises a single metallic layer of silver does not function when the thickness of this layer is less than or equal to 10 nm; this is attributed to a chemical reaction between the silver and the material of transparent top dielectric layer 6, observed in particular when this material is an oxide.

It has further been observed that the "buffer" function performed by the aluminum according to the invention was as efficient as the buffer function performed by other materials, in particular by a metal such as Ti, Cr, Ta, or a nitride of these metals, as described in the document U.S. Pat. No. 5,969,474 mentioned above. An important advantage of aluminum is that it can be vacuum deposited at low temperature (low sublimation temperature: 700° C.).

Other alternative embodiments of the invention can be envisaged without departing from the scope of the invention, in particular a top layer formed by several sub-layers of different transparent dielectric materials, for example a SiO-based sub-layer and an ITO-based sub-layer.

Non-doped organic materials can be used for injection and transporting charges (sub-layers 31 and 33) without departing from the scope of the invention. Without departing from the scope of the invention, charge-blocking sub-layers can also be added between injection and transporting sub-layers 31, 33 and light-emitting sub-layer 32.

The invention has been described in the case of a diode emitting "upwards", i.e. through its top electrode.

Figure 2:
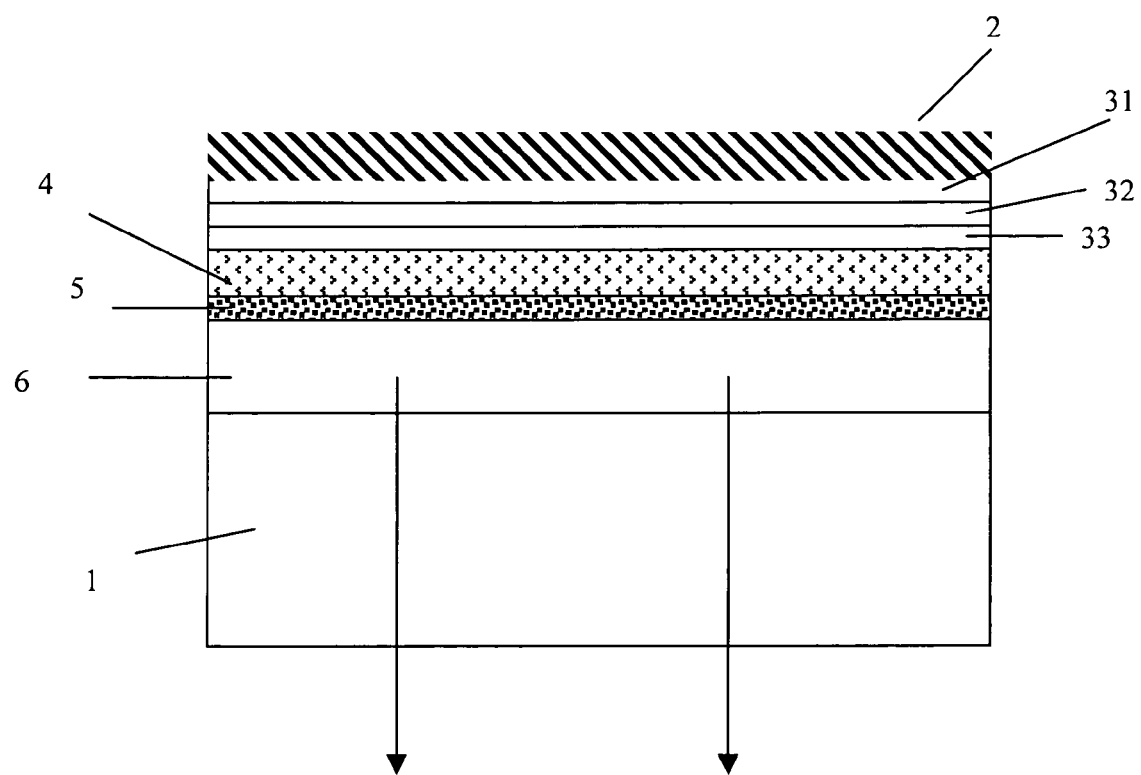
FIG. 2 is an alternative embodiment of FIG. 1 in which the substrate is transparent and adapted to a "downward" photon emission through the transparent bottom electrode which is in this case in direct contact with the substrate.

In FIG. 2, the invention also applies to diodes emitting "downwards", i.e. through their bottom electrode (and therefore their substrate 1 which is in this case transparent). The bottom electrode is also transparent and comprises the two metallic layers 4, 5 and dielectric layer 6, which is in direct contact with substrate 1.

The invention also applies to diodes called "transparent" which emit both upwards and downwards.

The invention is applicable to any kind of organic light-emitting diode and to lighting or display panels using such diodes.

The invention claimed is:

1. An organic light-emitting diode comprising a substrate, an organic light-emitting layer arranged between a first electrode and a transparent and semi-reflecting second electrode with a multilayer structure subdivided into:
   a first silver-based metallic layer in contact with the organic light-emitting layer,
   a second aluminum-based metallic layer, and
   and a third dielectric layer,
   the second metallic layer being inserted between the first metallic layer and the third dielectric layer of the transparent second electrode, the organic light-emitting layer comprising a doped sub-layer in contact with the first metallic layer of the transparent second electrode, and a thickness of said third dielectric layer being adjusted to limit absorption by said first and second metallic layers of light emitted by the organic light-emitting diode,
   the second metallic layer having a thickness between 3 and 10 nm, and a thickness of the first metallic layer being larger than the thickness of the second metallic layer.

2. The organic light-emitting diode according to claim 1 and with photon emission via the substrate, wherein the substrate is transparent, and the third dielectric layer of the transparent second electrode is in direct contact with the substrate.

3. The organic light-emitting diode according to claim 1 and with photon emission via the top face, wherein the substrate is non-transparent, and the third dielectric layer of the transparent second electrode is located at the top of the stack opposite from the substrate.

4. The organic light-emitting diode according to claim 1 wherein said third dielectric layer is made of a material chosen from the group formed by a transparent conducting oxide, in particular ITO and IZO.

5. The organic light-emitting diode according to claim 1 wherein said third dielectric layer is made of a material chosen from the group formed by SiO, ZnS, SnS, $TeO_2$ and $SnO_2$.

6. The organic light-emitting diode according to claim 1 wherein a total thickness of the first and second metallic layers is between 10 and 40 nm.

7. The organic light-emitting diode according to claim 1 wherein the first electrode is semi-reflecting or reflecting.

8. A lighting or image display panel comprising a plurality of organic light-emitting diodes according to claim 1.

9. The organic light-emitting diode according to claim 7 wherein a distance between the first and second electrodes is adjusted to optimize extraction performances of light emitted by the organic light-emitting diode.

\* \* \* \* \*